US011401159B2

United States Patent
Huang et al.

(10) Patent No.: US 11,401,159 B2
(45) Date of Patent: Aug. 2, 2022

(54) MEMS TRANSDUCING APPARATUS AND METHOD OF FABRICATING THE SAME

(71) Applicant: FORMOSA MATERIAL INDUSTRIAL CORP., Hsinchu (TW)

(72) Inventors: Chun-Lung Huang, Hsin-Chu (TW); Ying-Hsiang Chen, Hsin-Chu (TW); Fu-Hsuan Yang, Hsin-Chu County (TW)

(73) Assignee: FORMOSA MATERIAL INDUSTRIAL CORP., Hsinchu (TW)

(*) Notice: Subject to any disclaimer, the term of this patent is extended or adjusted under 35 U.S.C. 154(b) by 0 days.

(21) Appl. No.: 17/209,815

(22) Filed: Mar. 23, 2021

(65) Prior Publication Data

US 2021/0300748 A1 Sep. 30, 2021

(30) Foreign Application Priority Data

Mar. 24, 2020 (TW) ................................ 109109823

(51) Int. Cl.
*H01L 29/82* (2006.01)
*B81B 7/00* (2006.01)
*B81C 1/00* (2006.01)

(52) U.S. Cl.
CPC .......... *B81B 7/007* (2013.01); *B81C 1/00301* (2013.01); *B81B 2203/0127* (2013.01); *B81B 2203/0315* (2013.01); *B81B 2207/096* (2013.01)

(58) Field of Classification Search
CPC ........... B81B 7/007; B81B 2203/0127; B81B 2203/0315; B81B 2207/096; B81C 1/00301
See application file for complete search history.

(56) References Cited

U.S. PATENT DOCUMENTS

2014/0239768 A1* 8/2014 Johnson ................ H02N 1/006 310/300

* cited by examiner

*Primary Examiner* — Samuel A Gebremariam
(74) *Attorney, Agent, or Firm* — Muncy, Geissler, Olds & Lowe, P.C.

(57) ABSTRACT

A MEMS transducing apparatus includes a substrate, a conductive pad, a stacked structure of a transducing device, a first polymer layer, a second polymer layer and a third polymer layer. An upper cavity is formed through the substrate. The conductive pad is formed on a first surface of the substrate to cover a first opening of the upper cavity. The stacked structure of the transducing device is formed on the conductive pad. The first polymer layer is formed on the first surface of the substrate. A lower cavity is formed through the first polymer layer. The stacked structure of the transducing device is exposed within the lower cavity. The third polymer layer is formed on a second surface of the substrate to cover a second opening of the upper cavity. The second polymer layer is formed on the first polymer layer to cover a third opening of the lower cavity.

8 Claims, 13 Drawing Sheets

MEMS TRANSDUCING APPARATUS AND METHOD OF FABRICATING THE SAME

CROSS-REFERENCE TO RELATED APPLICATION

Figure 1:
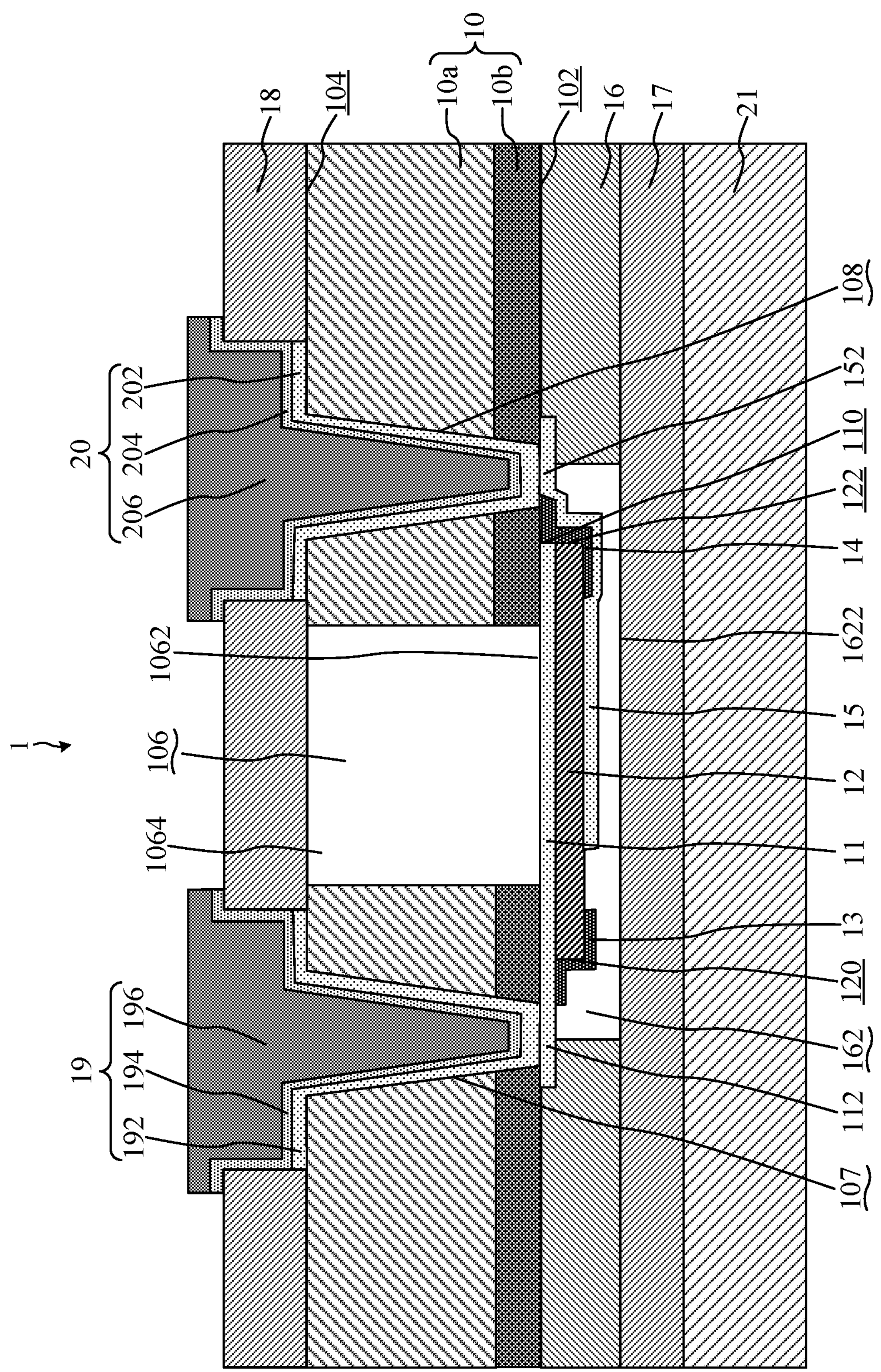

This utility application claims priority to Taiwan Application Serial Number 109109823, filed Mar. 24, 2020, which is incorporated herein by reference.

BACKGROUND OF THE INVENTION

1. Field of the Invention

This present invention relates to a micro-electro-mechanical system (MEMS) transducing apparatus and method of fabricating the same, and more particularly, to a MEMS transducing apparatus with upper and lower sealed cavities and method of fabricating the same.

2. Description of the Prior Art

MEMS transducing apparatuses having upper and lower sealed cavities and including stacked structures of transducing devices placed between the upper and lower sealed cavities have been applied to oscillators, resonators, radio frequency RF filter, energy harvesting apparatus, and other fields.

The prior art of MEMS transducing apparatuses in the above-mentioned application fields uses a first substrate, and is firstly to form a recessed structure on the first substrate. The prior art mostly uses a silicon substrate as the first substrate. Next, in the prior art, a sacrificial material layer is formed to fill the recessed structure, and then a stacked structure of a transducing device is formed on the first substrate and covers the sacrificial material layer. The material forming the sacrificial material layer can be silicon dioxide, aluminum, gallium, amorphous silicon, porous silicon, phosphor silicate glass (PSG), etc.

The stacked structure of the transducer device has micro-vias. The sacrificial material layer under the stacked structure of the transducer device is etched through the micro-vias to form a lower cavity. In the prior art, a second substrate is used, and a recessed structure is first formed on the second substrate. The prior art mostly uses a silicon substrate as the second substrate. In the prior art, the second substrate is turned over so that the recessed structure faces downward, and the first substrate and the second substrate are bonded together to form an upper cavity, and the stacked structure of the transducing device is placed between the upper cavity and the lower cavity.

In another prior art, an upper cavity formed by a polymer material is formed on the first substrate, and the stacked structure of the transducing device is placed between the upper cavity and the lower cavity. But, another prior art still use the sacrificial material layer and the micro-vias of the stacked structure of the transducing device to form the lower cavity.

However, the use of the sacrificial material layer and the micro-vias of the stacked structure of the transducing device to form the lower cavity makes the manufacture of MEMS transducing apparatuses of these prior arts time-consuming and low in yield. In addition, the epitaxial quality of the stacked structure of the transducing device stacked on the sacrificial material layer is also limited by the amorphous structure of the sacrificial material layer and is difficult to be improved, which affects the energy conversion efficiency of the stacked structure of the transducing device.

SUMMARY OF THE INVENTION

Accordingly, one scope of the invention is to provide a MEMS transducing apparatus with upper and lower sealed cavities and method of fabricating the same. In particular, the MEMS transducing apparatus according to the invention does not use the sacrificial material layer and the micro-vias of the stacked structure of the transducing device to form the lower cavity in the manufacture. The upper and lower cavities of the MEMS transducing apparatus according to the present invention are mostly formed of polymer materials.

A MEMS transducing apparatus according to a preferred embodiment of the invention includes a first substrate, a first conductive pad, a stacked structure of a transducing device, a first passivation layer, a second passivation layer, a second conductive pad, a first polymer layer, a second polymer layer, a third polymer layer, a first electrode, and a second electrode. The first substrate has a first surface, a second surface opposite to the first surface and an upper cavity. The first surface of the first substrate is electrically insulated. The upper cavity of the first substrate is formed through the first substrate. The upper cavity of the first substrate has a first opening formed at the first surface and a second opening formed at the second surface. The first conductive pad is formed on the first surface of the substrate, and covers the first opening of the upper cavity. The stacked structure of the transducing device is formed on the first conductive pad. The first passivation layer is formed to overlay a first edge of the stacked structure of the transducing device. The second passivation layer is formed to overlay a second edge of the stacked structure of the transducing device and a third edge of the first conductive pad. The first passivation layer and the second passivation layer can be formed at the same time, or can be formed in different process stages. The second conductive pad is formed to overlay the second passivation layer, and extends onto the stacked structure of the transducing device and the first surface of the first substrate. The first polymer layer is formed on the first surface of the first substrate, and has a lower cavity formed through the first polymer layer. The stacked structure of the transducing device is exposed within the lower cavity of the first polymer layer. The lower cavity of the first polymer layer has a third opening. The second polymer layer is formed on the first polymer layer to cover the third opening. The third polymer layer is formed on the second surface of the first substrate to cover the second opening. The first electrode is formed through the third polymer layer and the first substrate to contact a first end portion of the first conductive pad. The second electrode is formed through the third polymer layer and the first substrate to contact a second end portion of the second conductive pad.

In one embodiment, the first polymer layer can be formed of a first photosensitive polymer or a first non-photosensitive polymer.

In one embodiment, the second polymer layer can be formed of a second photosensitive polymer or a second non-photosensitive polymer.

In one embodiment, the third polymer layer can be formed of a third photosensitive polymer.

Further, the MEMS transducing apparatus according to the preferred embodiment of the invention also includes a second substrate. The second substrate is bonded on the second polymer layer.

In one embodiment, the first substrate can include a silicon substrate and a dielectric layer formed on the silicon substrate. The dielectric layer provides the first surface of the first substrate, and the silicon substrate provides the second surface of the first substrate.

A method of fabricating a MEMS transducing apparatus according to a preferred embodiment of the invention, firstly, is to prepare a first substrate. The first substrate has a first surface and a second surface opposite to the first surface. The first surface of first substrate is electrically insulated, and faces upward. Then, the method according to the invention is to form a first conductive pad on the first surface of the first substrate. Next, the method according to the invention is to form a stacked structure of a transducing device on the first conductive pad. Afterwards, the method according to the invention is to form a first passivation layer to overlay a first edge of the stacked structure of the transducing device. Subsequently, the method according to the invention is to form a second passivation layer to overlay a second edge of the stacked structure of the transducing device and a third edge of the first conductive pad. Then, the method according to the invention is to form a second conductive pad to overlay the second passivation layer. The second conductive pad extends onto the stacked structure of the transducing device and the first surface of the first substrate. Next, the method according to the invention is to form a first polymer layer on the first surface of the first substrate. The first polymer layer has a first cavity formed through the first polymer layer. The stacked structure of the transducing device is exposed within the first cavity. The first cavity has a first opening. Afterwards, the method according to the invention is to form a second polymer layer on the first polymer layer to cover the first opening. Subsequently, the method according to the invention is to bond a second substrate on the second polymer layer. Then, the method according to the invention is to turn over the resultant structure obtained in the above-mentioned step such that the second surface of the first substrate faces upward, and to thin the first substrate. Next, the method according to the invention is to form a first through hole, a second through hole and a second cavity through the first substrate, where a first end portion of the first conductive pad is exposed within the first through hole, a second end portion of the second conductive pad is exposed within the second through hole. The second cavity has a second opening formed at the first surface and a third opening formed at the second surface. The second opening is covered by the first conductive pad. Afterwards, the method according to the invention is to form a third polymer layer on the second surface of the first substrate to cover the third opening. Subsequently, the method according to the invention is to form a first electrode to fill the first through hole such the first electrode contacts the first end portion of the first conductive pad. Finally, the method according to the invention is to form a second electrode to fill the second through hole such that the second electrode contacts the second end portion of the second conductive pad.

Distinguishable from the prior arts, the MEMS transducing apparatus according to the invention does not use the sacrificial material layer and the micro-vias of the stacked structure of the transducing device to form the lower cavity. Therefore, the stacked structure of the transducing device stacked on the first substrate would have excellent epitaxial quality, the energy conversion efficiency of the MEMS transducing apparatus according to the invention could be relatively high. In addition, the upper and lower cavities of the MEMS transducing apparatus according to the invention are mostly formed of polymer materials. Therefore, the method of manufacturing the MEMS transducing apparatus according to the invention takes a short manufacturing process time with higher yield rate.

The advantage and spirit of the invention may be understood by the following recitations together with the appended drawings.

BRIEF DESCRIPTION OF THE APPENDED DRAWINGS

FIG. 1 a cross-sectional view illustratively showing a MEMS transducing apparatus according to a preferred embodiment of the invention.

FIG. 2 through FIG. 13 are cross-sectional views illustratively showing structures at various stages of a method, according to a preferred embodiment of the invention, of fabricating a MEMS transducing apparatus.

DETAILED DESCRIPTION OF THE INVENTION

Some preferred embodiments and practical applications of this present invention would be explained in the following paragraph, describing the characteristics, spirit, and advantages of the invention.

Referring to FIG. 1, this figure schematically illustrates a MEMS transducing apparatus 1 according to a preferred embodiment of the invention. FIG. 1 is a cross-sectional view of the MEMS transducing apparatus 1 according to the preferred embodiment of the invention. The MEMS transducing apparatus 1 according to the preferred embodiment of the invention can be implemented as an oscillator, a resonator, a radio frequency filter, a microelectromechanical microphone, an energy harvesting apparatus, and so on.

As shown in FIG. 1, the MEMS transducing apparatus 1 according to a preferred embodiment of the invention includes a first substrate 10, a first conductive pad 11, a stacked structure of a transducing device 12, a first passivation layer 13, a second passivation layer 14, a second conductive pad 15, a first polymer layer 16, a second polymer layer 17, a third polymer layer 18, a first electrode 19, and a second electrode 20.

The first substrate 10 has a first surface 102, a second surface 104 opposite to the first surface 102 and an upper cavity 106. The first surface 102 of the first substrate 10 is electrically insulated. The upper cavity 106 of the first substrate 10 is formed through the first substrate 10. The upper cavity 106 of the first substrate 10 has a first opening 1062 formed at the first surface 102 and a second opening 1064 formed at the second surface 104.

In one embodiment, the first substrate 10 can be formed of silicon, aluminum nitride, aluminum oxide, quartz, glass, sapphire, or the like.

In one embodiment, as shown in FIG. 1, the first substrate 10 can include, but not limited to, a silicon substrate **10*a* and a dielectric layer 10*b* formed on the silicon substrate 10*a*. The dielectric layer 10*b* can be, but not limited to, formed of silicon nitride, silicon oxide, silicon oxide with dopants, aluminum nitride, gallium nitride, quartz, etc. The dielectric layer 10*b* provides the first surface 102 of the first substrate 10, and the silicon substrate 10*a* provides the second surface 104 of the first substrate 10. In practical application, the preferred resistance value of the silicon substrate 10*a* constituting the first substrate 10** is, but not limited to, higher than 3000 Ohm·cm.

The first conductive pad 11 is formed on the first surface 102 of the substrate, and covers the first opening 1062 of the upper cavity 106.

In one embodiment, the first conductive pad 11 can be a thin film formed of a metal material such as Ti, TiW, W, Cr, Al, Mo, Cu, Au, Ag or a combination of the foregoing metal materials.

The stacked structure of the transducing device 12 is formed on the first conductive pad 11. According to different application fields, the stacked structure of the transducing device 12 can be a thin film formed of Si, $Ba_xSr_{(1-x)}TiO_3$ (BST), $Al_xSc_{(1-x)}N$, AlN, GaN, $Ga_xAl_{(1-c)}N$, $Al_2O_3$, etc.

The first passivation layer 13 is formed to overlay a first edge 120 of the stacked structure of the transducing device 12. In the example shown in FIG. 1, the first passivation layer 13 extends onto the stacked structure of the transducing device 12 and the first conductive pad 11, but it is not limited to this.

The second passivation layer 14 is formed to overlay a second edge 122 of the stacked structure of the transducing device 12 and a third edge 110 of the first conductive pad 11. In the example shown in FIG. 1, the second passivation layer 14 extends onto the stacked structure of the transducing device 12 and the first surface 102 of the first substrate 10, but it is not limited to this. The first passivation layer 13 and the second passivation layer 14 can be formed at the same time, or can be formed in different process stages.

The second conductive pad 15 is formed to overlay the second passivation layer 14, and extends onto the stacked structure of the transducing device 12 and the first surface 102 of the first substrate 10.

In one embodiment, the second conductive pad 15 can be a thin film formed of a metal material such as Ti, TiW, W, Cr, Al, Mo, Cu, Au, Ag or a combination of the foregoing metal materials.

The first polymer layer 16 is formed on the first surface 102 of the first substrate 10, and has a lower cavity 162 formed through the first polymer layer 16. The stacked structure of the transducing device 12 is exposed within the lower cavity 162 of the first polymer layer 16. The lower cavity 162 of the first polymer layer 16 has a third opening 1622.

In one embodiment, the first polymer layer 16 can be formed of a first photosensitive polymer or a first non-photosensitive polymer. The first photosensitive polymer can be polydimethylsiloxane (PDMS), "SU-8 Series" (manufactured by Kayaku Microchem), or epoxy series, for example, TMMR, TMMF or NC-S0075A-F (all manufactured by TOKYO OHKA KOGYO CO., LTD.), polybenzoxazole (PBO), etc. If the first polymer layer 16 is formed of a first non-photosensitive polymer material, a subsequent patterning process must be performed to form the lower cavity 162.

The second polymer layer 17 is formed on the first polymer layer 16 to cover the third opening 1622 to seal the lower cavity 162.

In one embodiment, the second polymer layer 17 can be formed of a second photosensitive polymer or a second non-photosensitive polymer. The second photosensitive polymer can be polydimethylsiloxane (PDMS), "SU-8 Series" (manufactured by Kayaku Microchem), or epoxy series, for example, TMMR, TMMF or NC-S0075A-F (all manufactured by TOKYO OHKA KOGYO CO., LTD.), polybenzoxazole (PBO), etc. The second polymer layer 17 may cover the first polymer layer 16 in the form of a dry film.

The third polymer layer 18 is formed on the second surface 104 of the first substrate 10 to cover the second opening 1064 of the upper cavity 106 to seal the upper cavity 106.

In one embodiment, the third polymer layer 18 can be formed of a third photosensitive polymer. The third photosensitive polymer can be polydimethylsiloxane (PDMS), "SU-8 Series" (manufactured by Kayaku Microchem), or epoxy series, for example, TMMR, TMMF or NC-S0075A-F (all manufactured by TOKYO OHKA KOGYO CO., LTD.), polybenzoxazole (PBO), etc.

The first electrode 19 is formed through the third polymer layer 18 and the first substrate 10 to contact a first end portion 112 of the first conductive pad 11.

The second electrode 20 is formed through the third polymer layer 18 and the first substrate 10 to contact a second end portion 152 of the second conductive pad 15.

In one embodiment, as shown in FIG. 1, the first substrate 10 also has a first through hole 107 and a second through hole 108. The first electrode 19 includes a first metal film 192 overlaying the bottom, inner walls, and periphery of the opening of the first through hole 107, a first underlying metal film 194 overlaying the first metal film 192, and a first metal bump 196 filling the first through hole 107. The second electrode 20 includes a second metal film 202 overlaying the bottom, inner walls, and periphery of the opening of the second through hole 108, a second underlying metal film 204 overlaying the second metal film 202, and a second metal bumps 206 filling the second through hole 108. The first metal film 192 and the second metal film 202 can be films formed of metal materials such as Ti, TiW, W, Cr, Al, Mo, Cu, Au, Ag, or a combination of the foregoing metal materials. The first underlying metal film 194 and the second underlying metal film 204 can be films formed of metal materials such as Ti, TiW, W, Cr, Al, Cu, Ni, or a combination of the foregoing metal materials. The first metal bump 196 and the second metal bump 206 can be formed of Cu added with Ni (or NiPd), Sn alloy (lead-free), but not limited to this.

Also as shown in FIG. 1, further, the MEMS transducing apparatus 1 according to the preferred embodiment of the invention also includes a second substrate 21. The second substrate 21 is bonded on the second polymer layer 17. In one embodiment, the second substrate 21 can be a silicon substrate or a glass substrate, but it is not limited thereto.

Referring to FIG. 2 through FIG. 13. These figures illustratively show cross-sectional views of structures at various stages of a method, according to a preferred embodiment of the invention, of fabricating the MEMS transducing apparatus 1 as shown in FIG. 1.

Figure 2:
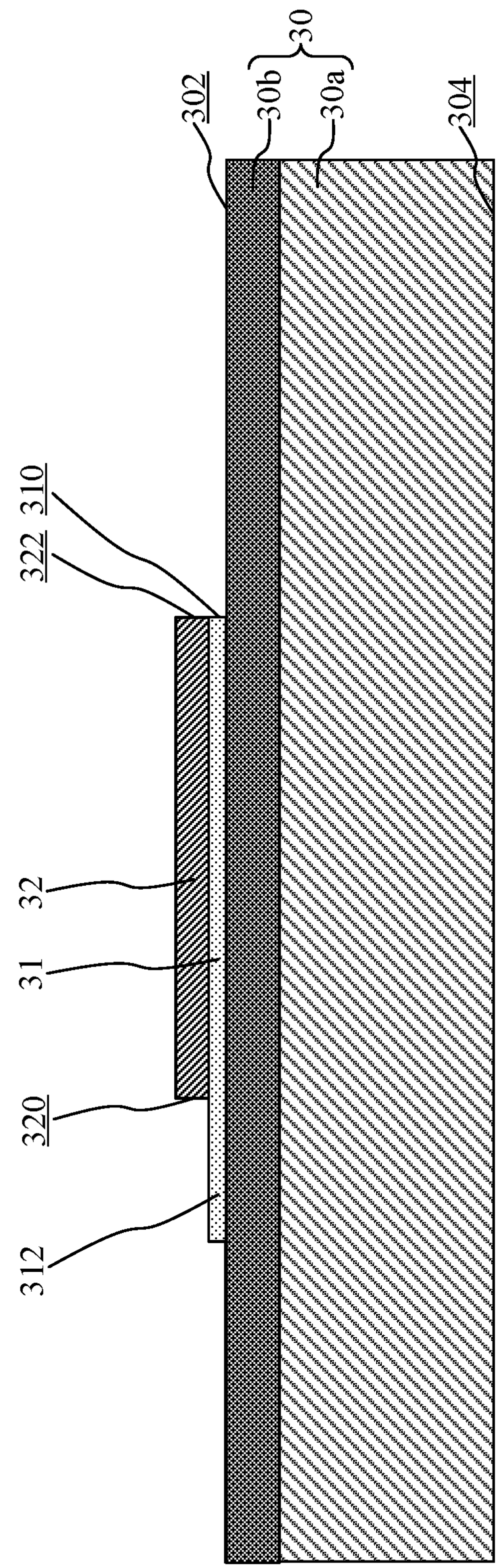

As shown FIG. 2, firstly, the method according to the preferred embodiment of the invention is to prepare a first substrate 30.

The first substrate 30 has a first surface 302 and a second surface 304 opposite to the first surface 302. The first surface 302 of first substrate 30 is electrically insulated, and faces upward.

In one embodiment, the first substrate 30 can be formed of silicon, aluminum nitride, aluminum oxide, quartz, glass, sapphire, or the like.

In one embodiment, as shown in FIG. 2, the first substrate 30 can include, but not limited to, a silicon substrate **30*a* and a dielectric layer 30*b* formed on the silicon substrate 30*a*. The dielectric layer 30*b* can be, but not limited to, formed of silicon nitride, silicon oxide, silicon oxide with dopants, aluminum nitride, gallium nitride, quartz, etc. The dielectric layer 30*b* provides the first surface 302** of the first substrate 30, and the silicon substrate 30*a* provides the second surface 304 of the first substrate 30. In practical application, the preferred resistance value of the silicon substrate 30*a* constituting the first substrate 30 is, but not limited to, higher than 3000 Ohm·cm.

Also as shown in FIG. 2, then, the method according to the invention is to form a first conductive pad 31 on the first surface 302 of the first substrate 30.

In one embodiment, the first conductive pad 31 can be a thin film formed of a metal material such as Ti, TiW, W, Cr, Al, Mo, Cu, Au, Ag or a combination of the foregoing metal materials.

Also as shown in FIG. 2, next, the method according to the invention is to form a stacked structure of a transducing device 32. The stacked structure of a transducing device 32 is bonded on the first conductive pad 31. According to different application fields, the stacked structure of the transducing device 32 can be a thin film formed of Si, $Ba_xSr_{(1-x)}TiO_3$(BST), $Al_xSc_{(1-x)}N$, AlN, GaN, $Ga_xAl_{(1-x)}N$, $Al_2O_3$, etc.

Figure 3:
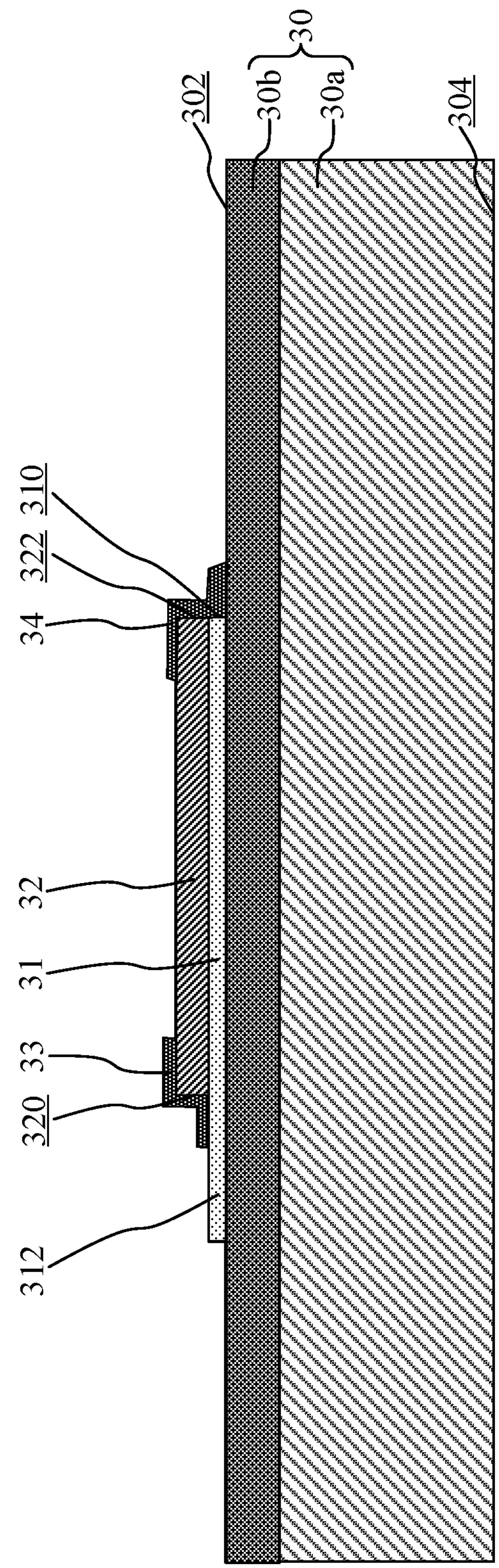

Afterwards, as shown in FIG. 3, the method according to the invention is to form a first passivation layer 33 to overlay a first edge 320 of the stacked structure of the transducing device 32. In the example shown in FIG. 3, the first passivation layer 33 extends onto the stacked structure of the transducing device 32 and the first conductive pad 31, but it is not limited to this.

Also as shown in FIG. 3, subsequently, the method according to the invention is to form a second passivation layer 34 to overlay a second edge 322 of the stacked structure of the transducing device 32 and a third edge 310 of the first conductive pad 31. In the example shown in FIG. 3, the second passivation layer 34 extends onto the stacked structure of the transducing device 32 and the first surface 302 of the first substrate 30, but it is not limited to this.

In one embodiment, the first passivation layer 33 and the second passivation layer 34 can be formed at the same time, or can be formed in different process stages.

Figure 4:
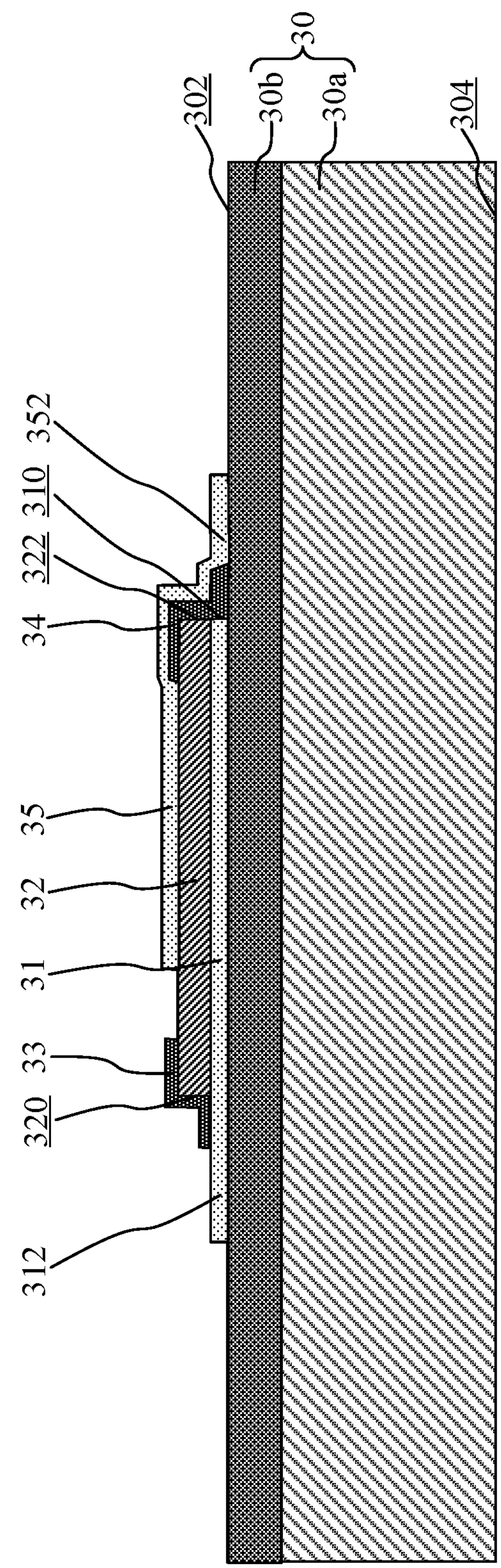

Then, as shown in FIG. 4, the method according to the invention is to form a second conductive pad 35 to overlay the second passivation layer 34. The second conductive pad 35 extends onto the stacked structure of the transducing device 32 and the first surface 302 of the first substrate 30.

In one embodiment, the second conductive pad 35 can be a thin film formed of a metal material such as Ti, TiW, W, Cr, Al, Mo, Cu, Au, Ag or a combination of the foregoing metal materials.

Figure 5:
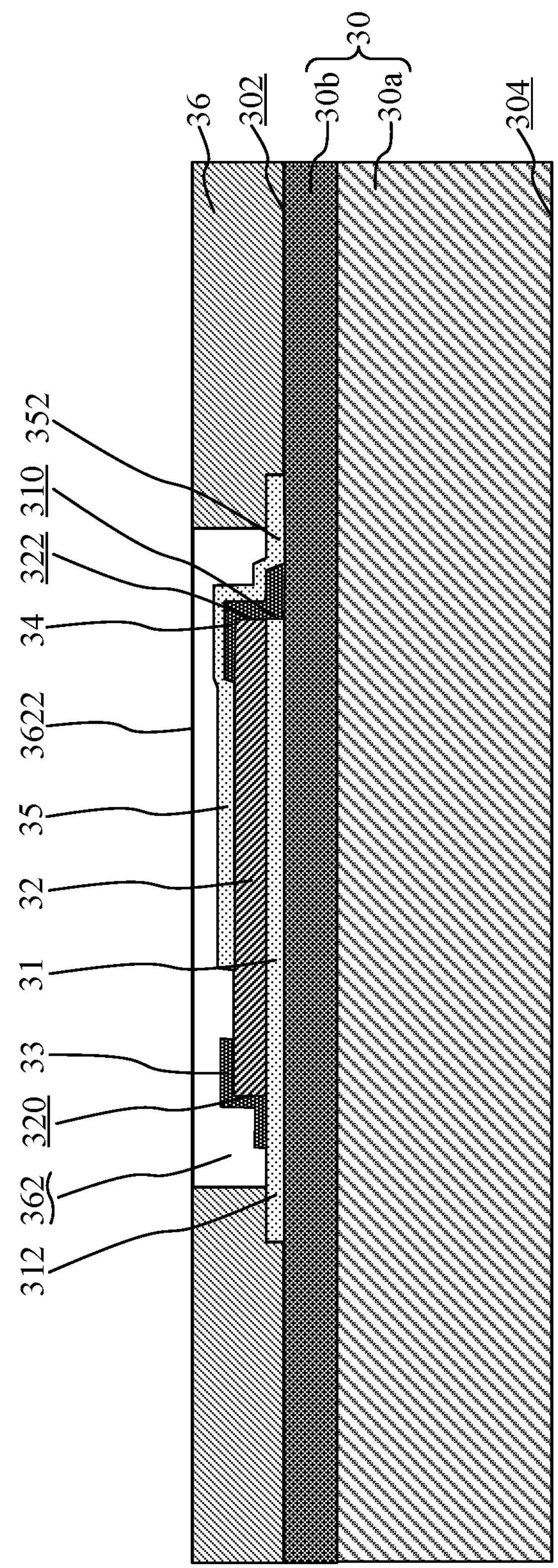

Next, as shown in FIG. 5, the method according to the invention is to form a first polymer layer 36 on the first surface 302 of the first substrate 30. The first polymer layer 36 has a first cavity 362 formed through the first polymer layer 36. The stacked structure of the transducing device 32 is exposed within the first cavity 362. The first cavity 362 has a first opening 3622.

In one embodiment, the first polymer layer 36 can be formed of a first photosensitive polymer or a first non-photosensitive polymer. The first photosensitive polymer can be polydimethylsiloxane (PDMS), "SU-8 Series" (manufactured by Kayaku Microchem), or epoxy series, for example, TMMR, TMMF or NC-S0075A-F (all manufactured by TOKYO OHKA KOGYO CO., LTD.), polybenzoxazole (PBO), etc. If the first polymer layer 36 is formed of a first non-photosensitive polymer material, a subsequent patterning process must be performed to form the lower cavity 362.

Figure 6:
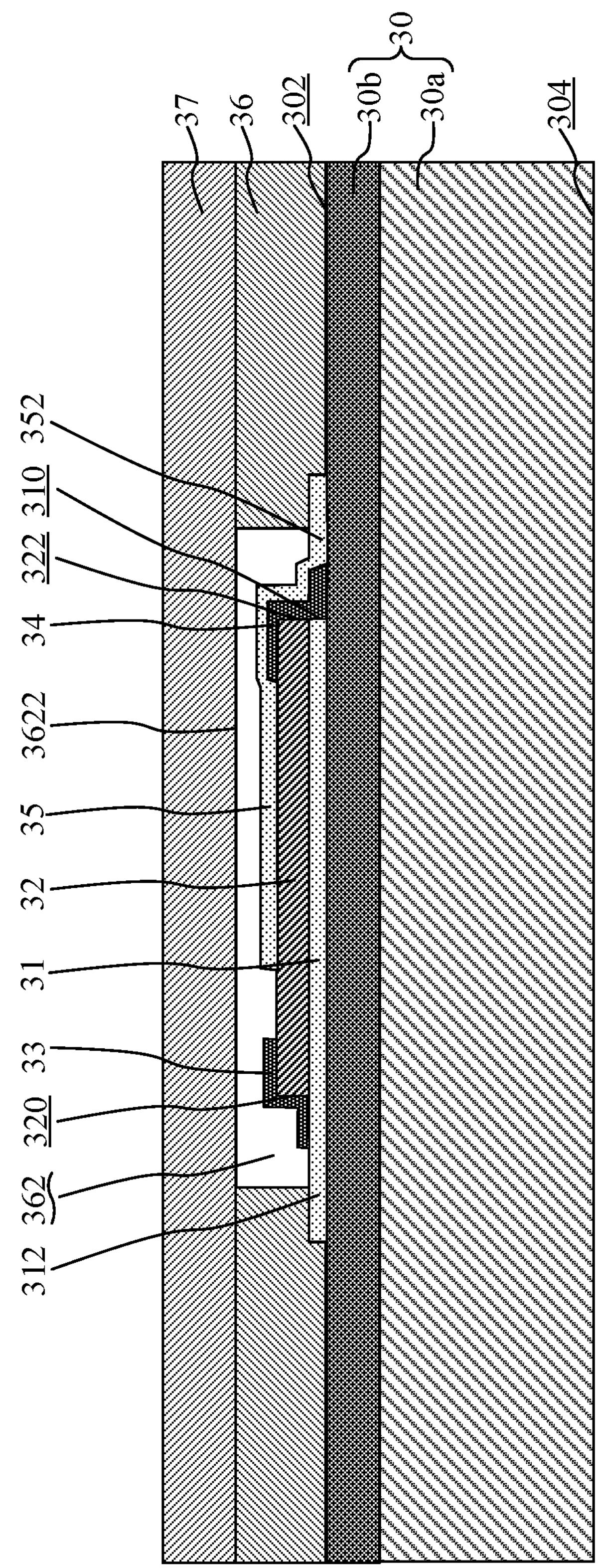

Afterwards, as shown in FIG. 6, the method according to the invention is to form a second polymer layer 37 on the first polymer layer 36 to cover the first opening 3622 of the first cavity 362 to seal the first cavity 362.

In one embodiment, the second polymer layer 37 can be formed of a second photosensitive polymer or a second non-photosensitive polymer. The second photosensitive polymer can be polydimethylsiloxane (PDMS), "SU-8 Series" (manufactured by Kayaku Microchem), or epoxy series, for example, TMMR, TMMF or NC-S0075A-F (all manufactured by TOKYO OHKA KOGYO CO., LTD.), polybenzoxazole (PBO), etc. The second polymer layer 37 may cover the first polymer layer 16 in the form of a dry film.

Figure 7:
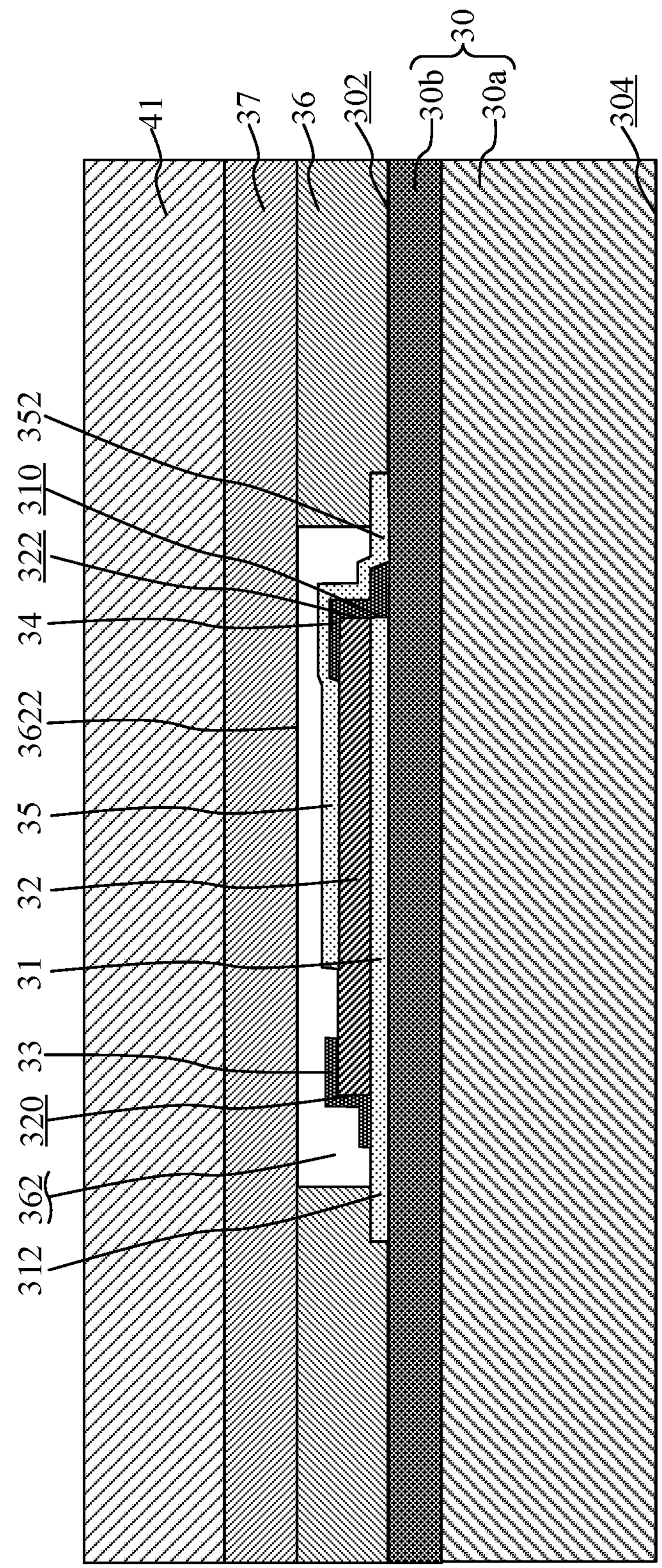

Subsequently, as shown in FIG. 7, the method according to the invention is to bond a second substrate 41 on the second polymer layer 37. In one embodiment, the second substrate 41 can be a silicon substrate or a glass substrate, but it is not limited thereto. The bonding between the second substrate 41 and the second polymer layer 37 can be carried out by applying an adhesive on the second polymer layer 37, and then the second substrate 41 and the second polymer layer 37 can be bonded together by the adhesive. The bonding between the second base material 41 and the second polymer layer 37 can also use the adhesiveness of the second polymer layer 37 or use a heating process to bond the second substrate 41 and the second polymer layer 37 together.

In one embodiment, the thickness of the second substrate 41 can be, but not limited to, less than 200 g m.

Figure 8:
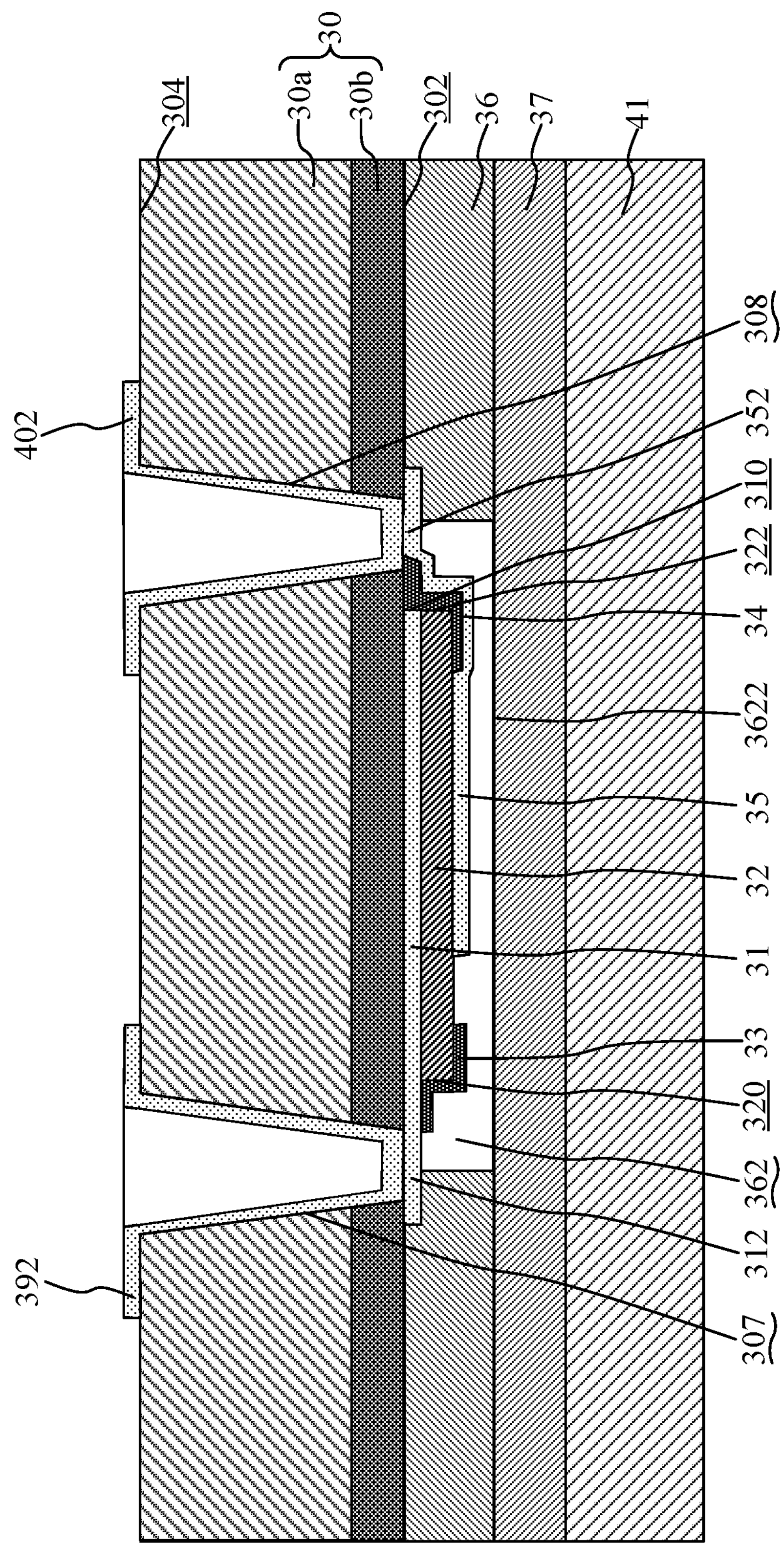

Then, as shown in FIG. 8, the method according to the invention is to turn over the resultant structure obtained in the above-mentioned step (as shown in FIG. 7), such that the second surface 304 of the first substrate 30 faces upward. And then, the method according to the invention is to reduce the thickness of the first substrate 30 to less than 200 g m.

Also as shown in FIG. 8, next, the method according to the invention is to perform an etching process to form a first through hole 307 and a second through hole 308 through the first substrate 30. A first end portion 312 of the first conductive pad 31 is exposed within the first through hole 307, and a second end portion 352 of the second conductive pad 35 is exposed within the second through hole 308.

Also as shown in FIG. 8, afterwards, the method according to the invention is to form a first metal film 392 overlaying the bottom, inner walls, and periphery of the opening of the first through hole 307, and to form a second metal film 402 overlaying the bottom, inner walls, and periphery of the opening of the second through hole 308. The first metal film 392 and the second metal film 402 can be formed at the same time. The first metal film 392 and the second metal film 402 can be films formed of metal materials such as Ti, TiW, W, Cr, Al, Mo, Cu, Au, Ag, or a combination of the foregoing metal materials.

Figure 9:
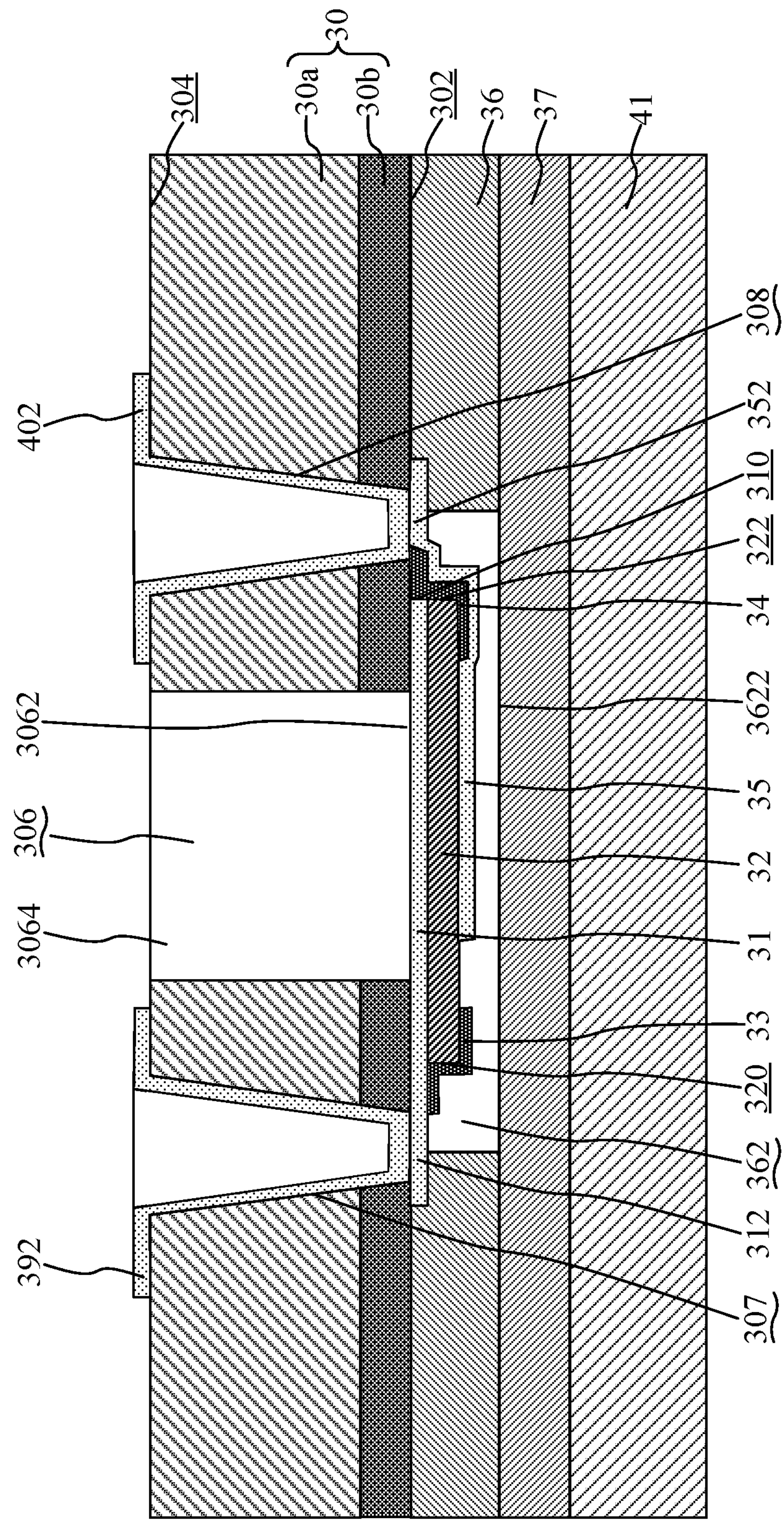

Subsequently, as shown in FIG. 9, the method according to the invention is to perform another etching process to a second cavity 306 through the first substrate 30. The second cavity 306 has a second opening 3062 formed at the first surface 302 of the first substrate 30 and a third opening 3064 formed at the second surface 304 of the first substrate 30. The second opening 3062 of the second cavity 306 is covered by the first conductive pad 31.

Figure 10:
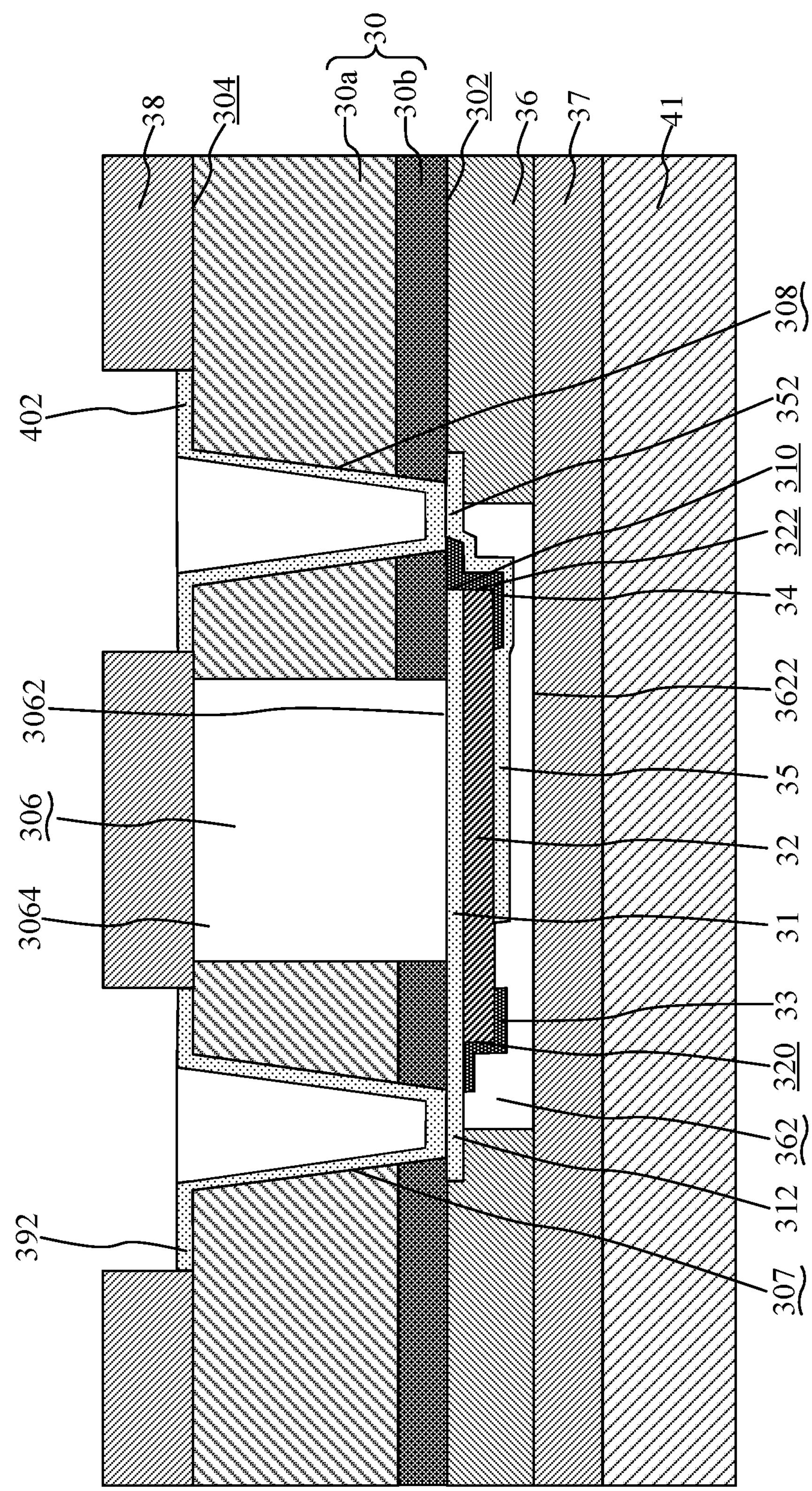

Then, as shown in FIG. 10, the method according to the invention is to form a third polymer layer 38 on the second surface 304 of the first substrate 30 to cover the third opening 3064 of the second cavity 306 to seal the second cavity 306.

In one embodiment, the third polymer layer 38 can be formed of a third photosensitive polymer. The third photosensitive polymer can be polydimethylsiloxane (PDMS), "SU-8 Series" (manufactured by Kayaku Microchem), or epoxy series, for example, TMMR, TMMF or NC-S0075A-F (all manufactured by TOKYO OHKA KOGYO CO., LTD.), polybenzoxazole (PBO), etc. The third polymer layer 38 can be laminated on the second surface 304 of the first substrate 30 by a third photosensitive polymer. In addition to covering the third opening 3064 of the second cavity 306, the first metal film 392 and the second metal film 402 cannot be overlaid by the third polymer layer 38, or can be partially overlaid by the third polymer layer 38.

Figure 11:
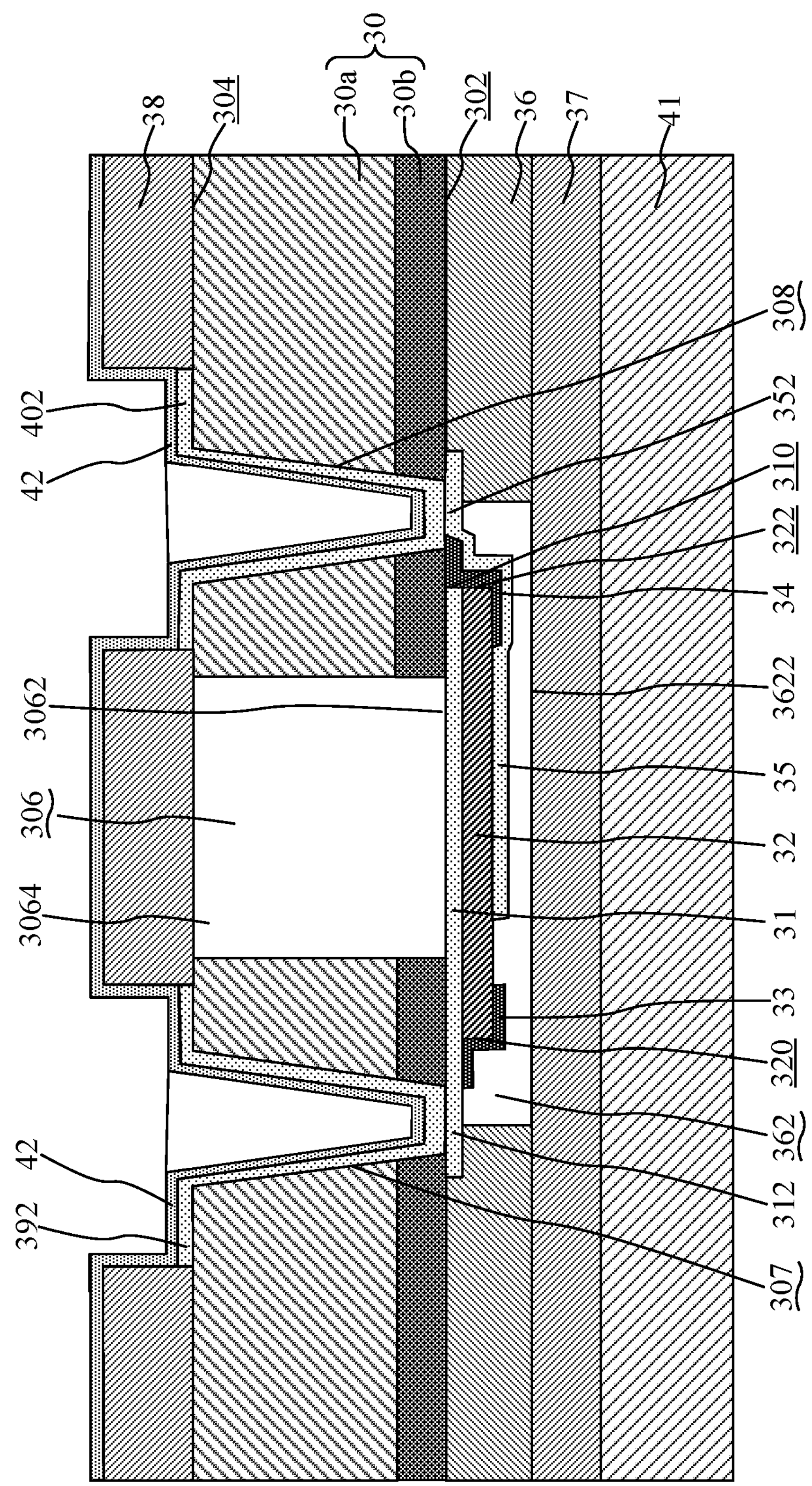

Next, as shown in FIG. 11, the method according to the preferred embodiment of the invention is to form an underlying metal film 42 to overlay the third polymer layer 38, the first metal film 392 and the second metal film 402. The first through hole 307 and the second through hole 308 generally maintain their original shapes. The underlying metal film 42 can be a film formed of metal materials such as Ti, TiW, W, Cr, Al, Cu, Ni, or a combination of the foregoing metal materials.

Figure 12:
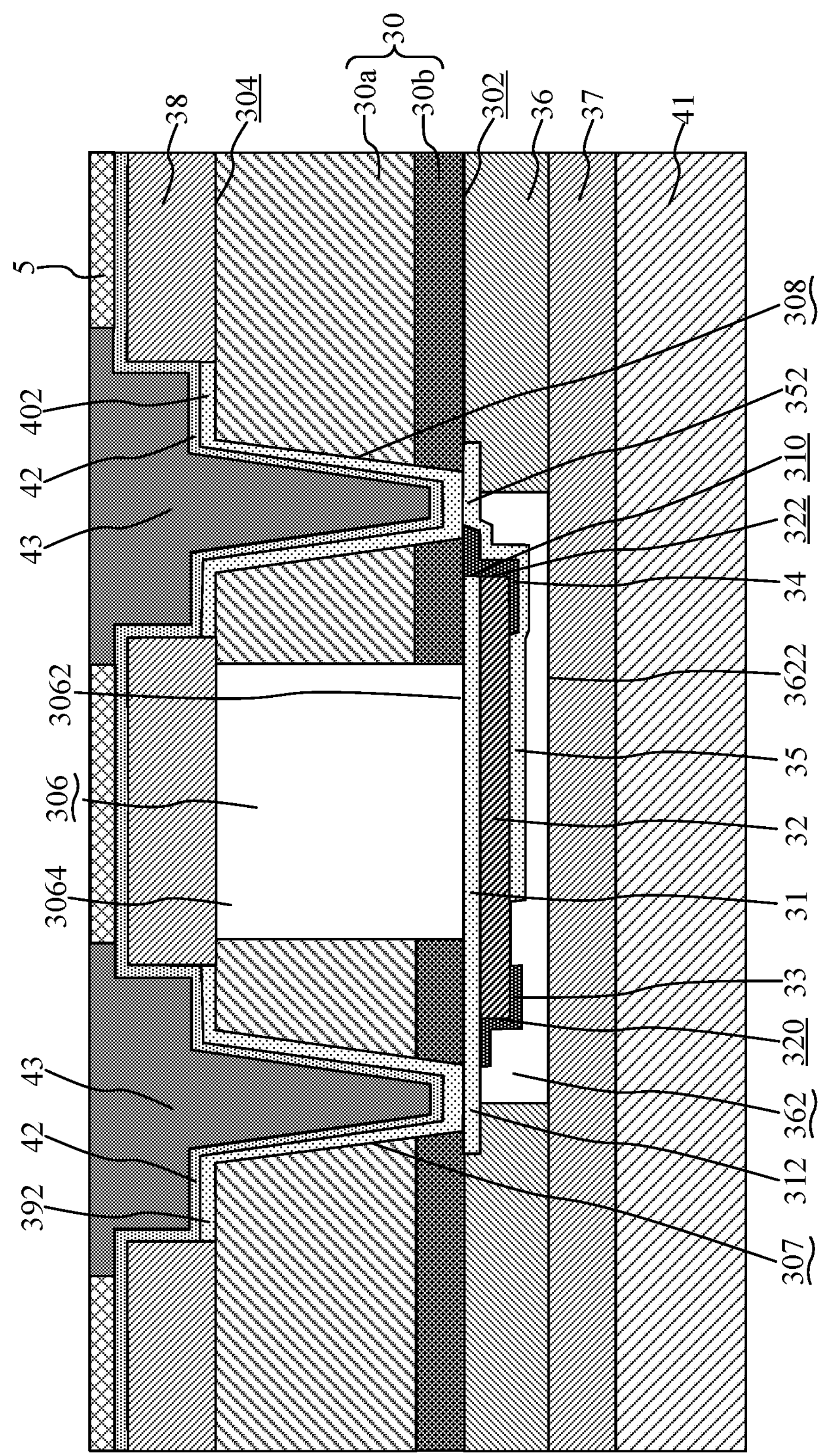

Afterwards, as shown in FIG. 12, the method according to the preferred embodiment of the invention is to partially form a photoresist layer 5 to overlay the third polymer layer 38, but not to overlay the first through hole 307, the second through hole 308 and above thereof.

Also as shown in FIG. 12, subsequently, the method according to the preferred embodiment of the invention is to form a metal layer 43 to fill the first through hole 307 and the second through hole 308. The metal layer 43 can be formed of Cu added with Ni (or NiPd), Sn alloy (lead-free), but not limited to this.

Figure 13:
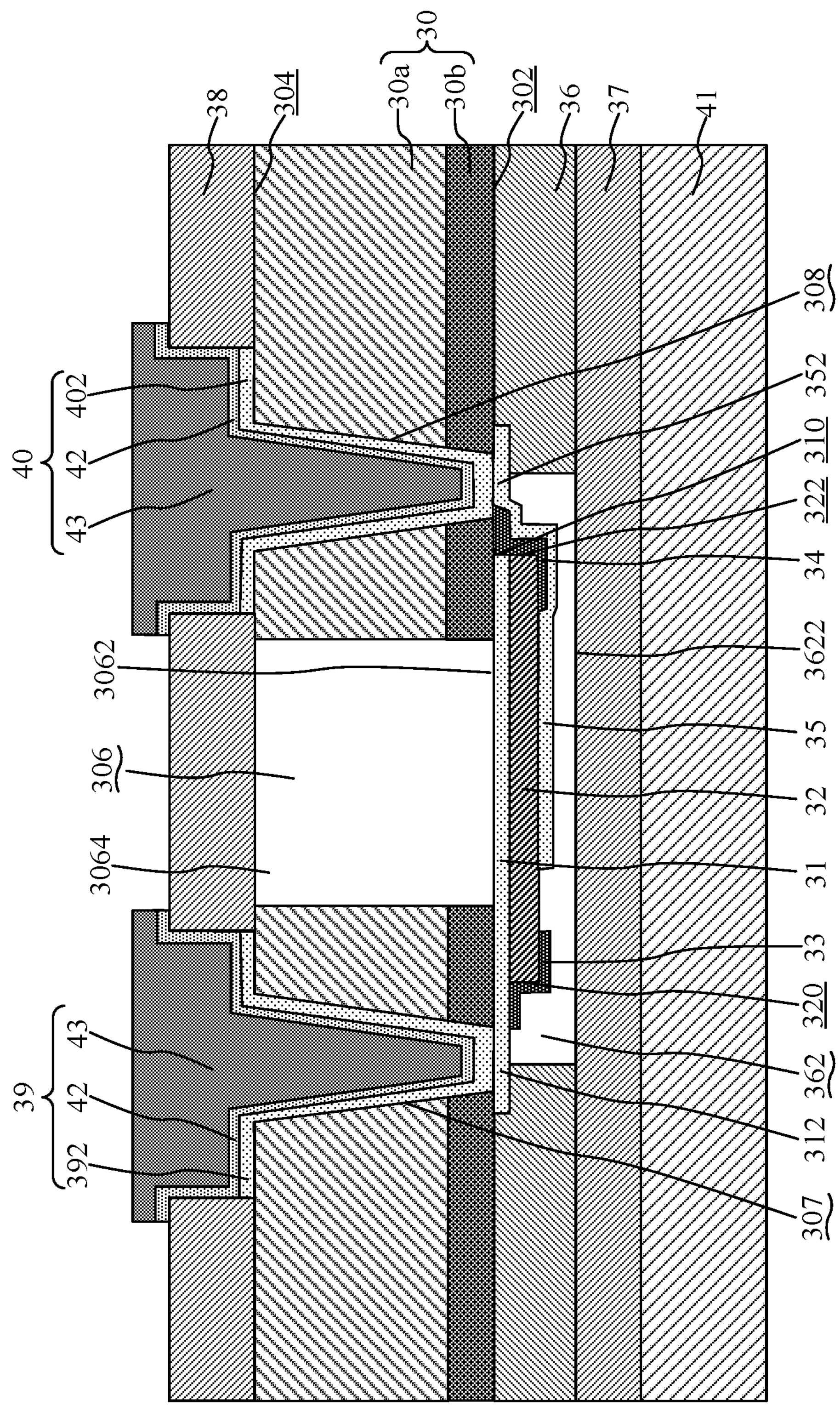

Finally, as shown in FIG. 13, the method according to the preferred embodiment of the invention is to remove the photoresist layer 5, and to partially etch the underlying metal film 42 such that the third polymer layer 38 is exposed, and the first electrode 39 and the second electrode 40 are formed. The first electrode 39 is composed of the first metal film 392, the underlying metal film 42 and the metal layer 43. The second electrode 40 is composed of the second metal film 402, the underlying metal film 42 and the metal layer 43. The first electrode 39 penetrates the third polymer layer 38 and the first substrate 30, and then contacts the first end portion 312 of the first conductive pad 31. The second electrode 40 penetrates the third polymer layer 38 and the first substrate 30 and then contacts the second end portion 352 of the second conductive pad 35.

Optionally, the method according to the preferred embodiment of the invention is to remove the second substrate 41.

With the detailed description of the above preferred embodiments of the invention, it is clear to understand that the MEMS transducing apparatus according to the invention does not use the sacrificial material layer and the micro-vias of the stacked structure of the transducing device to form the lower cavity. Therefore, the stacked structure of the transducing device stacked on the first substrate would have good epitaxial quality, the energy conversion efficiency of the MEMS transducing apparatus according to the invention could be relatively high. In addition, the upper and lower cavities of the MEMS transducing apparatus according to the invention are mostly formed of polymer materials. The symmetrical polymer-Si-Polymer structures would also reduce the stress effects observed from asymmetrical transducer structures. Using the polymer materials for capping, the method of manufacturing the MEMS transducing apparatus according to the invention could take a short manufacturing process time with high yield rates.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A MEMS transducing apparatus, comprising:

a first substrate, having a first surface, a second surface opposite to the first surface and an upper cavity, the first surface being electrically insulated, the upper cavity being formed through the first substrate, the upper cavity having a first opening formed at the first surface and a second opening formed at the second surface;

a first conductive pad, formed on the first surface of the first substrate to cover the first opening;

a stacked structure of a transducing device, formed on the first conductive pad;

a first passivation layer, formed to overlay a first edge of the stacked structure of the transducing device;

a second passivation layer, formed to overlay a second edge of the stacked structure of the transducing device and a third edge of the first conductive pad;

a second conductive pad, being formed to overlay the second passivation layer and extending onto the stacked structure of the transducing device and the first surface of the first substrate;

a first polymer layer, being formed on the first surface of the first substrate and having a lower cavity formed through the first polymer layer, the stacked structure of the transducing device being exposed within the lower cavity, the lower cavity having a third opening;

a second polymer layer, formed on the first polymer layer to cover the third opening;

a third polymer layer, formed on the second surface of the first substrate to cover the second opening;

a first electrode, formed through the third polymer layer and the first substrate to contact a first end portion of the first conductive pad; and a second electrode, formed through the third polymer layer and the first substrate to contact a second end portion of the second conductive pad.

2. The MEMS transducing apparatus of claim 1, wherein the first polymer layer is formed of a first photosensitive polymer or a first non-photosensitive polymer, the second polymer layer is formed of a second photosensitive polymer or a second non-photosensitive polymer, and the third polymer layer is formed of a third photosensitive polymer.

3. The MEMS transducing apparatus of claim 2, further comprising a second substrate bonded on the second polymer layer.

4. The MEMS transducing apparatus of claim 2, wherein the first substrate comprises a silicon substrate and a dielectric layer formed on the silicon substrate, the dielectric layer provides the first surface of the first substrate, and the silicon substrate provides the second surface of the first substrate.

5. A method of fabricating a MEMS transducing apparatus, comprising the steps of:

(a) preparing a first substrate having a first surface and a second surface opposite to the first surface, the first surface being electrically insulated and facing upward;

(b) forming a first conductive pad on the first surface of the first substrate;

(c) forming a stacked structure of a transducing device on the first conductive pad;

(d) forming a first passivation layer to overlay a first edge of the stacked structure of the transducing device;

(e) forming a second passivation layer to overlay a second edge of the stacked structure of the transducing device and a third edge of the first conductive pad;

(f) forming a second conductive pad to overlay the second passivation layer, the second conductive pad extending onto the stacked structure of the transducing device and the first surface of the first substrate;

(g) forming a first polymer layer on the first surface of the first substrate, the first polymer layer having a first cavity formed through the first polymer layer, the stacked structure of the transducing device being exposed within the first cavity, the first cavity having a first opening;

(h) forming a second polymer layer on the first polymer layer to cover the first opening;

(i) bonding a second substrate on the second polymer layer;

(j) turning over the resultant structure obtained in step (i) such that the second surface of the first substrate faces upward, and thinning the first substrate;

(k) forming a first through hole, a second through hole and a second cavity through the first substrate, wherein a first end portion of the first conductive pad is exposed within the first through hole, a second end portion of the second conductive pad is exposed within the second through hole, the second cavity has a second opening formed at the first surface and a third opening formed at the second surface, the second opening is covered by the first conductive pad;

(l) forming a third polymer layer on the second surface of the first substrate to cover the third opening;

(m) forming a first electrode to fill the first through hole such the first electrode contacts the first end portion of the first conductive pad; and (n) forming a second electrode to fill the second through hole such that the second electrode contacts the second end portion of the second conductive pad.

6. The method of claim 5, wherein the first polymer layer is formed of a first photosensitive polymer or a first non-photosensitive polymer, the second polymer layer is formed of a second photosensitive polymer or a second non-photosensitive polymer, and the third polymer layer is formed of a third photosensitive polymer.

7. The method of claim 6, further comprising the step of removing the second substrate.

8. The method of claim 6, wherein the first substrate comprises a silicon substrate and a dielectric layer formed on the silicon substrate, the dielectric layer provides the first surface of the first substrate, and the silicon substrate provides the second surface of the first substrate.

* * * * *